(12) United States Patent
Zhang (10) Patent No.: US 8,339,781 B2
(45) Date of Patent: Dec. 25, 2012

(54) ELECTRONIC DEVICE AND RAIL MODULE

(75) Inventor: Yang Zhang, Shanghai (CN)

(73) Assignee: Inventec Corporation, Taipei (TW)

( * ) Notice: Subject to any disclaimer, the term of this patent is extended or adjusted under 35 U.S.C. 154(b) by 244 days.

(21) Appl. No.: 12/973,927

(22) Filed: Dec. 21, 2010

(65) Prior Publication Data
US 2012/0134100 A1 May 31, 2012

(30) Foreign Application Priority Data

Nov. 30, 2010 (TW) ................................ 99141533 A (51) Int. Cl.
*H05K 5/00* (2006.01)
*H05K 7/16* (2006.01)
*H05K 7/14* (2006.01)
*H01R 4/00* (2006.01)
*H01R 13/46* (2006.01)

(52) U.S. Cl. ........... 361/679.39; 361/679.37; 361/679.4; 361/724; 361/725; 361/726; 174/365; 174/542; 174/559; 174/59; 174/60

(58) Field of Classification Search .. 361/679.31–679.4, 361/679.55–679.6, 724–727; 174/363–387, 174/542, 559–563, 59–64, 138 B, 138 D, 174/170; 369/75.11, 75.21, 76, 77.11, 77.21, 369/78, 79, 80, 81, 82
See application file for complete search history.

(56) References Cited

U.S. PATENT DOCUMENTS

| 2003/0042824 A1* | 3/2003 | Coffin et al. | 312/223.2 |
| 2008/0164795 A1* | 7/2008 | Peng et al. | 312/334.5 |

* cited by examiner

*Primary Examiner* — Jayprakash N Gandhi
*Assistant Examiner* — Jerry Wu
(74) *Attorney, Agent, or Firm* — Jianq Chyun IP Office (57) ABSTRACT

An electronic device includes a chassis, a rail module and an electronic module. The rail module includes a rail, first and second sliding elements. The rail disposed in the chassis has a locking slot. The first sliding element slidably disposed on the rail has an elastic piece. The elastic piece has a locking hook facing the rail. The second sliding element slidably disposed on the first sliding element and fixed to the electronic module is suitable of sliding along a path relatively to the first sliding element. The locking hook leaning against the rail is located on the path. The locking hook is suitable of being pushed by the second sliding element to be buckled to the locking slot and moves away from the path. Then, the second sliding element crosses the elastic piece for sliding along the first sliding element, and the electronic module moves out from the chassis.

19 Claims, 11 Drawing Sheets

ELECTRONIC DEVICE AND RAIL MODULE

CROSS-REFERENCE TO RELATED APPLICATION

This application claims the priority benefit of Taiwan application serial no. 99141533, filed on Nov. 30, 2010. The entirety of the above-mentioned patent application is hereby incorporated by reference herein and made a part of this specification.

BACKGROUND

1. Field of the Invention

The invention relates to an electronic device and a rail module. Particularly, the invention relates to an electronic device having a pluggable electronic module and a rail module thereof.

2. Description of Related Art

A server is a core computer in a network system used for serving various computers, which can provide functions such as storage and print service for network users, and provide clients to share various resources within the network environment. A basic structure of the server is approximately the same to a general personal computer, which is composed of a central processing unit (CPU), a memory and an input/output (I/O) device, etc., and the devices are connected through a bus. A north bridge chip is used to connect the CPU and the memory, and the I/O device is connected through a south bridge chip. A chassis structure of the server has three evolution stages from earlier tower chassis to rack mount chassis stressing centrality, and then blade servers of high-density calculation.

Taking a rack mount server as an example, the rack mount server is a server with an appearance designed according to uniform standards, which is used in collaboration with a cabinet. The rack mount server can be regarded as a tower server with an optimized structure, and a design principle thereof is to reduce a space occupation of the server as far as possible. Many professional network devices apply the rack mount structure, and have a flat shape as that of a drawer, for example, switches, routers and hardware firewalls, etc. A width of the rack mount server is 19 inches, and a height thereof applies a unit of U (1U=1.75 inches=44.45 mm), and the servers are generally complied with standards of 1U, 2U, 3U, 4U, 5U or 7U.

The size of the cabinet is also complied with a common industrial standard, which is generally between 22U and 42U. The cabinet includes a detachable sliding rack according to the height thereof, and the user can flexibly adjust the height according to a height of the server, so as to store network devices such as a server, a hub, a disk array, etc. After the server is settled, the I/O lines thereof are all led out from the rear of the cabinet (all interfaces of the rack mount server are also located at the rear of the cabinet), and are uniformly disposed in a cable slot of the cabinet, and are attached with labels to facilitate management.

If the server has a pluggable hard disc module, rails used for sliding the hard disc module are required. Generally, when a user pulls out the hard disc module from a chassis, a part of the hard disc module is still connected to the rails and located in the chassis, which is inconvenient for repairing or replacing the hard disc module.

SUMMARY OF THE INVENTION

The invention is directed to an electronic device, in which an electronic module can be entirely pulled out from a chassis.

The invention is directed to a rail module, where an electronic module disposed thereon can be entirely pulled out from a chassis.

The invention provides an electronic device including a chassis, a rail module and an electronic module. The rail module includes a first rail, a first sliding element and a second sliding element. The first rail is disposed in the chassis and has a first locking slot. The first sliding element is slidably disposed on the first rail and has a first elastic piece. The first elastic piece has a first locking hook facing to the first rail. The second sliding element is slidably disposed on the first sliding element and suitable of sliding along a path relatively to the first sliding element. The first locking hook leans against the first rail and is located on the path. When the second sliding element is driven to move from a first position along a first direction, the second sliding element pushes the first locking hook to drive the first sliding element to move to the first locking slot along the first direction, so that the first locking hook is buckled to the first locking slot and moves away from the path. When the second sliding element is continually driven to move along the first direction, the second sliding element resists an elastic force of the first elastic piece and crosses over the first elastic piece to reach a second position. The electronic module is fixed to the second sliding element. When the second sliding element is located at the first position, the electronic module is located in the chassis, and when the second sliding element is located at the second position, the electronic module is entirely pulled out from the chassis.

The invention provides a rail module adapted to an electronic device. The electronic device includes a chassis and an electronic module. The rail module includes a first rail, a first sliding element and a second sliding element. The first rail is disposed in the chassis and has a first locking slot. The first sliding element is slidably disposed on the first rail and has a first elastic piece. The first elastic piece has a first locking hook facing to the first rail. The second sliding element is slidably disposed on the first sliding element and fixed to the electronic module, and is suitable of sliding along a path relatively to the first sliding element. The first locking hook leans against the first rail and is located on the path. When the second sliding element is driven to move from a first position along a first direction, the second sliding element pushes the first locking hook to drive the first sliding element to move to the first locking slot along the first direction, so that the first locking hook is buckled to the first locking slot and moves away from the path. When the second sliding element is continually driven to move along the first direction, the second sliding element resists an elastic force of the first elastic piece and crosses over the first elastic piece to reach a second position. When the second sliding element is located at the first position, the electronic module is located in the chassis, and when the second sliding element is located at the second position, the electronic module is entirely pulled out from the chassis.

In an embodiment of the invention, the electronic device is a server, and the electronic module is a hard disc module.

In an embodiment of the invention, the first sliding element has a second locking slot, and the second sliding element has a second elastic piece. When the second sliding element reaches the second position, one end of the second elastic piece is buckled to the second locking slot to stop the second sliding element from continually moving along the first direction.

In an embodiment of the invention, the second elastic piece has a second locking hook, and the second locking hook is adapted to be buckled to the second locking slot. The second locking hook has a guiding slope and a stop surface opposite to the guiding slope. The second locking hook is adapted to be guided by the guiding slope to buckle to the second locking slot, and is adapted to be positioned at the second locking slot due to interference of the stop surface.

In an embodiment of the invention, the first rail has a blocking wall. When the second sliding element is driven to move from the second position along a second direction opposite to the first direction to push the first elastic piece, the first sliding element is driven to move towards the blocking wall and leans against the blocking wall, so that the first sliding element is blocked from moving along the second direction. When the second sliding element is continually driven to move along the second direction, the second sliding element resists the elastic force of the first elastic piece and crosses over the first elastic piece to reach the first position. When the second sliding element is located at the first position, the second sliding element leans against the blocking wall, so that the second sliding element is blocked from moving along the second direction.

In an embodiment of the invention, the rail module further includes a second rail and a third sliding element. The second rail is disposed in the chassis and parallel to the first rail. The third sliding element is slidably disposed on the second rail and fixed to the electronic module, where the electronic module is located between the first rail and the second rail.

In an embodiment of the invention, the electronic module includes a plurality of hard discs, and each of the hard discs has a handle. When the electronic module is located in the chassis, at least a part of the handles is located in the second slide rail.

In an embodiment of the invention, when the first locking hook of the first sliding element is buckled to the first locking slot, the first sliding element is partially protruded out from the first rail, and the second position is located at the part of the first sliding element protruded out from the first rail.

In an embodiment of the invention, the first elastic piece has a supporting portion. The supporting portion faces to the first rail and props up the first locking hook from the first rail so as to facilitate the second sliding element to contact the first locking hook.

In an embodiment of the invention, a first end of the first elastic piece is fixed to a surface of the first sliding element, and the first locking hook and the supporting portion are formed on a second end of the first elastic piece, and when the second sliding element is located at the first position, the second end is located between the first end and the second sliding element.

According to the above descriptions, in the invention, the first sliding element is slidably disposed on the first rail, and the second sliding element fixed to the electronic module is slidably disposed on the first sliding element, and the first sliding element has the first elastic piece adapted to be pushed by the second sliding element. Based on interactions of the first sliding element, the second sliding element and the first elastic piece, the rail module may achieve a multi-stage sliding effect. The electronic module can be entirely pulled out from the chassis along with sliding of the first sliding element and the second sliding element, so that the user can easily repair or replace the electronic module.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
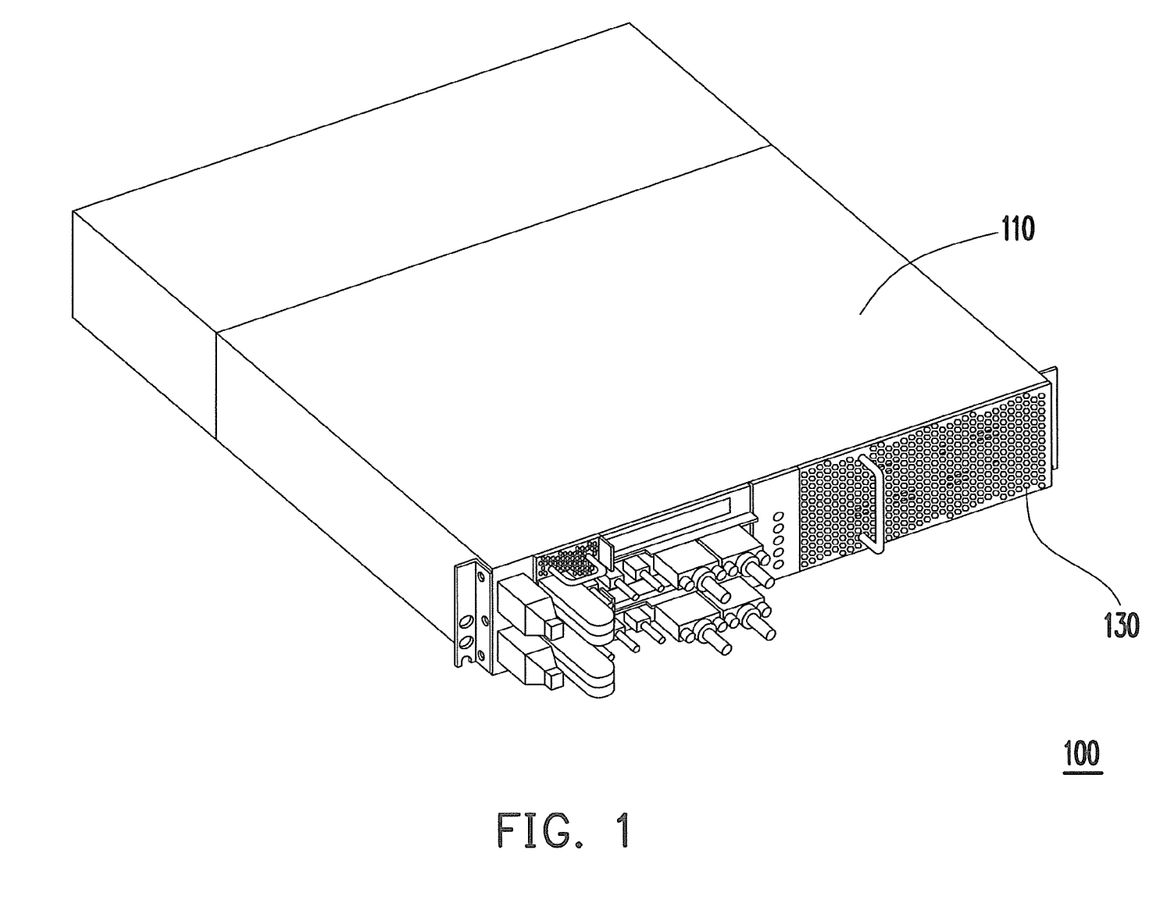
FIG. 1 is a three-dimensional view of an electronic device according to an embodiment of the invention.
Figure 2:
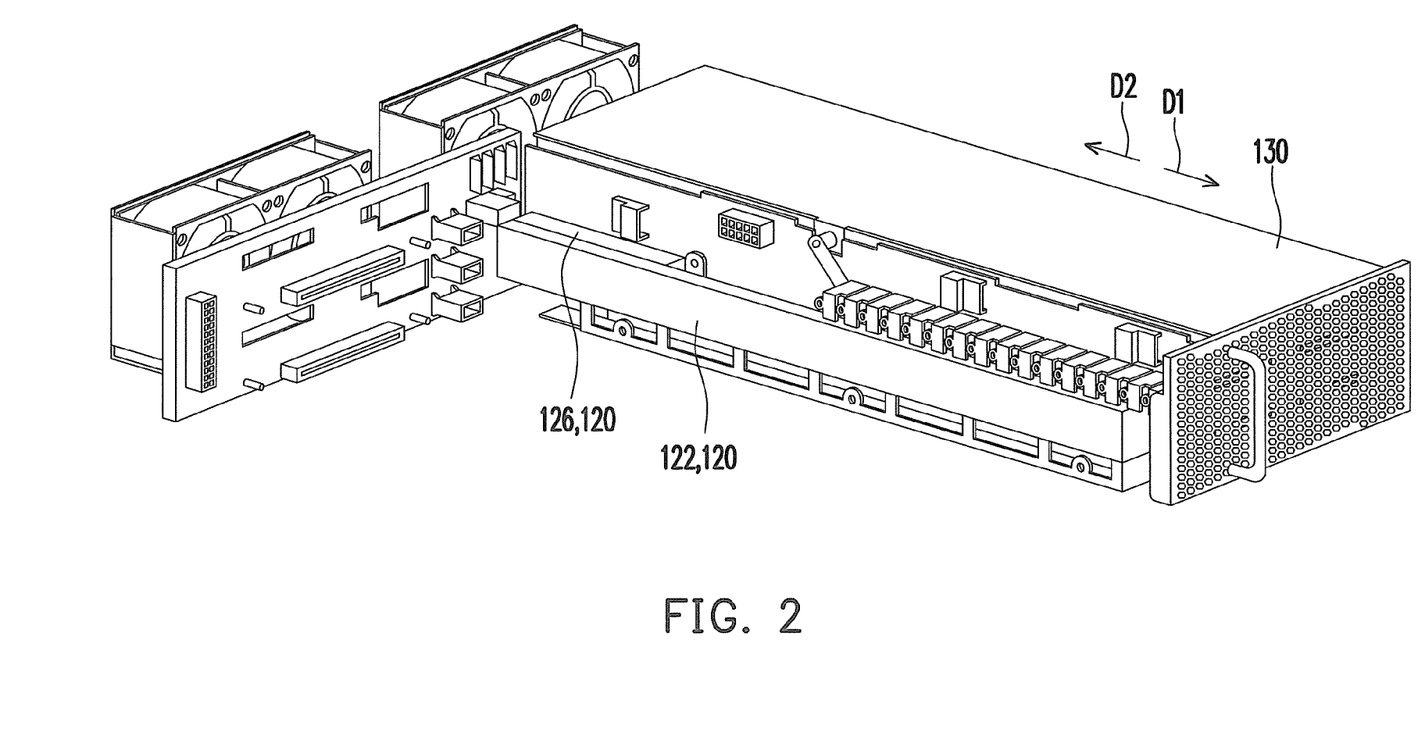
FIG. 2 is a three-dimensional view of a part of components of the electronic device of FIG. 1.
Figure 3:
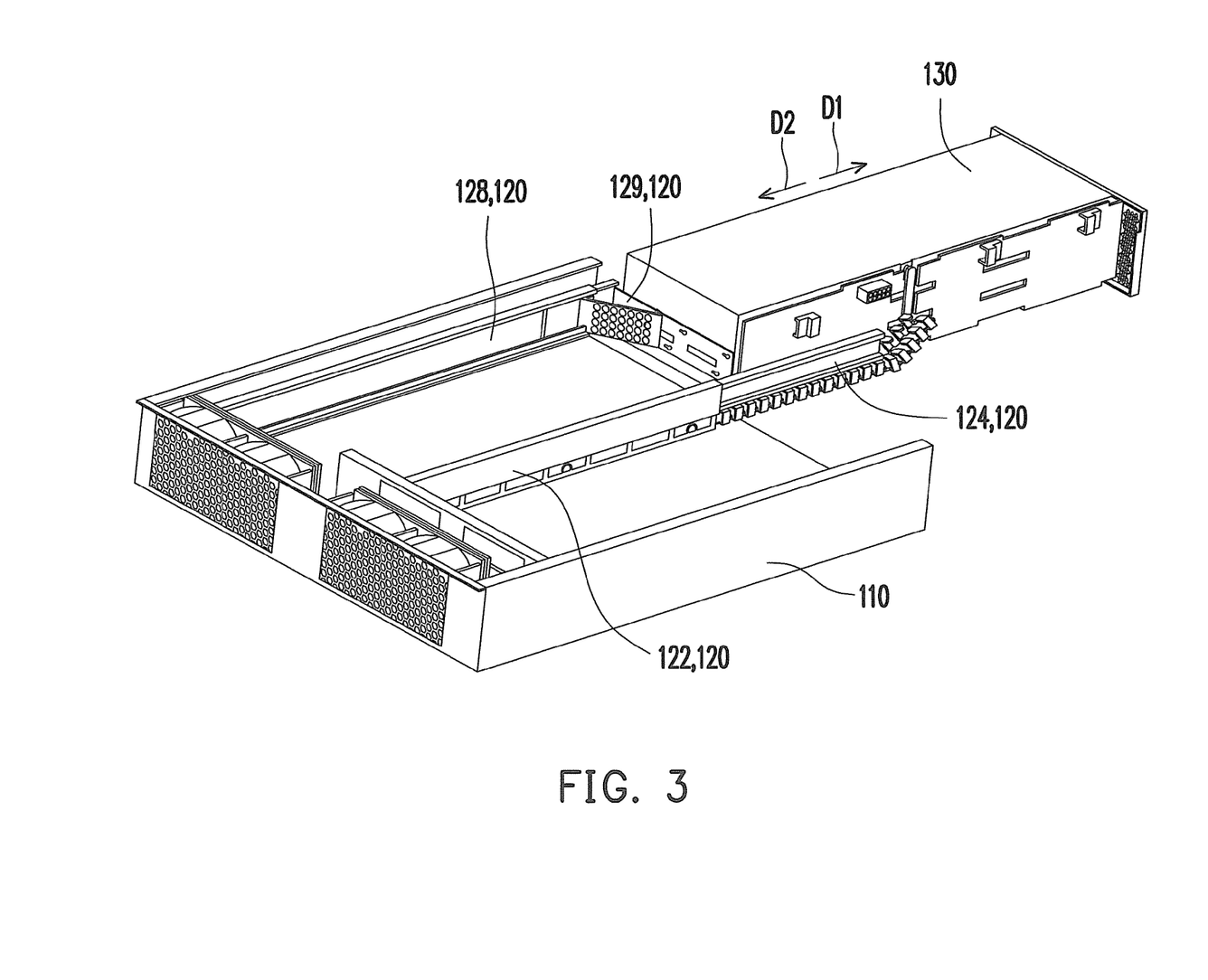
FIG. 3 is a three-dimensional view of the electronic device of FIG. 1 in case that an electronic module is pulled out from a chassis.

FIG. 1 is a three-dimensional view of an electronic device according to an embodiment of the invention. FIG. 2 is a three-dimensional view of a part of components of the electronic device of FIG. 1. FIG. 3 is a three-dimensional view of the electronic device of FIG. 1 in case that an electronic module is pulled out from a chassis. Referring to FIG. 1 to FIG. 3, the electronic device 100 of the present embodiment includes a chassis 110, a rail module 120 and an electronic module 130. The rail module 120 includes a first rail 122, a first sliding element 124 and a second sliding element 126. The first rail 122 is disposed in the chassis 110. The first sliding element 124 is slidably disposed on the first rail 122, and the second sliding element 126 is slidably disposed on the first sliding element 124 and fixed to the electronic module 130. In the present embodiment, the electronic device 100 is, for example, a server, and the electronic module 130 is, for example, a pluggable hard disc module.

Figure 4:
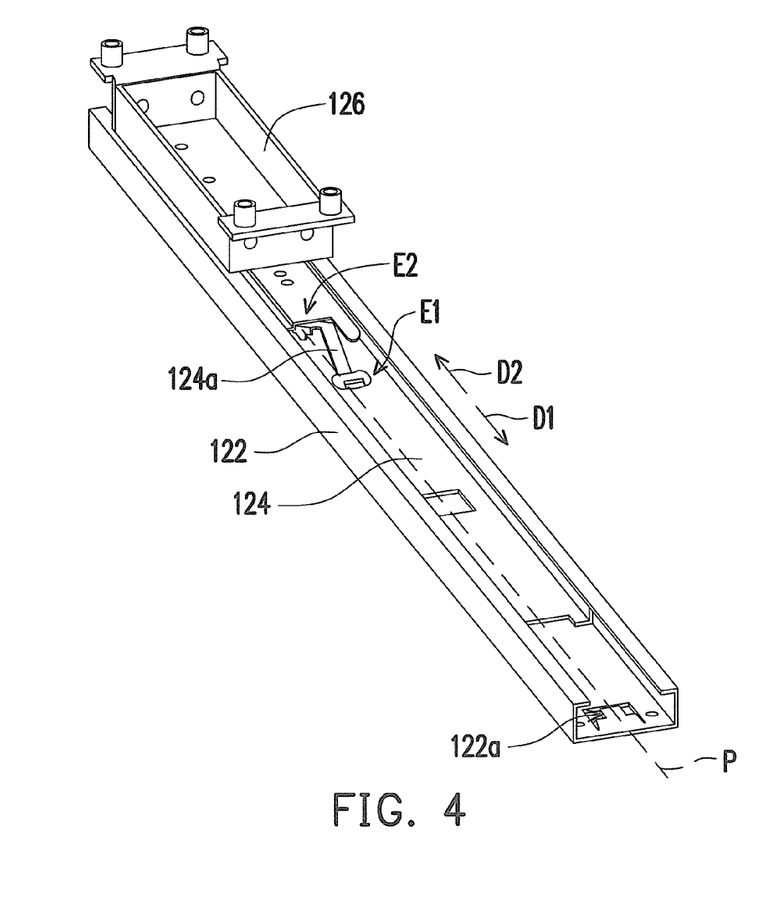
FIG. 4 is a three-dimensional view of a part of components of a rail module of FIG. 2.
Figure 5A:
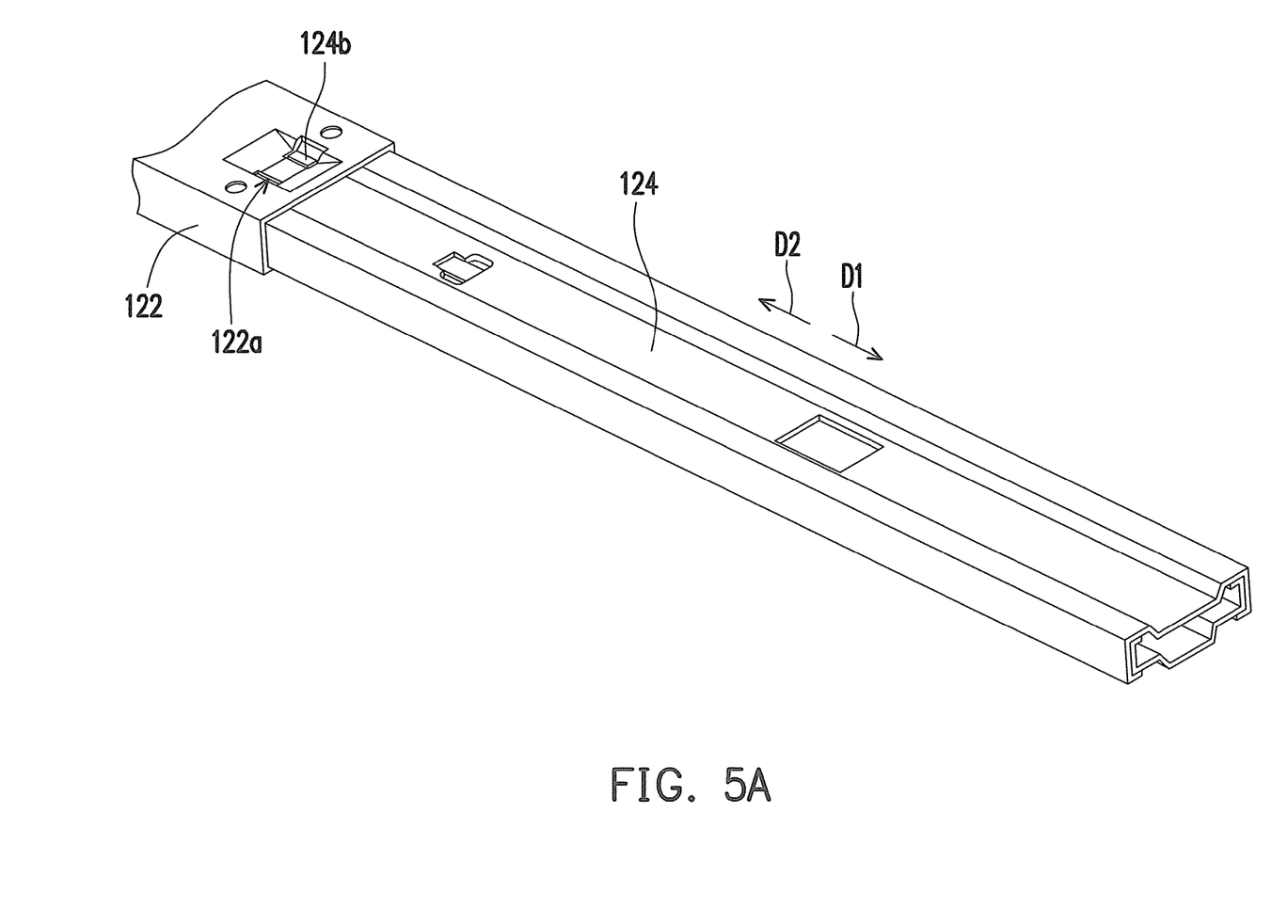
FIG. 5A to FIG. 5D are three-dimensional views of an operation flow of the rail module of FIG. 4.

FIG. 4 is a three-dimensional view of a part of components of the rail module of FIG. 2. FIG. 5A to FIG. 5D are three-dimensional views of an operation flow of the rail module of FIG. 4. FIG. 6 is a three-dimensional view of a first elastic piece of FIG. 4. Referring to FIG. 4, the first rail 122 has a locking slot 122a, and the first sliding element 124 has a first elastic piece 124a. Referring to FIG. 4 and FIG. 5A, the first elastic piece 124a has a first locking hook 124b facing to the first rail 122. The second sliding element 126 is slidably disposed on the first sliding element 124 and suitable of sliding along a path P shown in FIG. 4 relatively to the first sliding element 124, where the first locking hook 124b leans against the first rail 124 and is located on the path P as that shown in FIG. 4. When a user wants to fetch the electronic module 130 from the chassis 110, the user may pull the electronic module 130 of FIG. 2 to drive the second sliding element 126 to move from a position shown in FIG. 2 along a first direction D1, so that the second sliding element 126 pushes the first locking hook 124b to drive the first sliding element 124 to move from the position shown in FIG. 4 to a position shown in FIG. 5A along the first direction D1, so that the first locking hook 124b of the first elastic piece 124a is buckled to the locking slot 122a to form a structural interference, and the first locking hook 124b moves away from the path P, so that the second sliding element 126 is not blocked by the first locking hook 124b and is suitable for sliding along the path P in a subsequent operation.

Figure 5B:
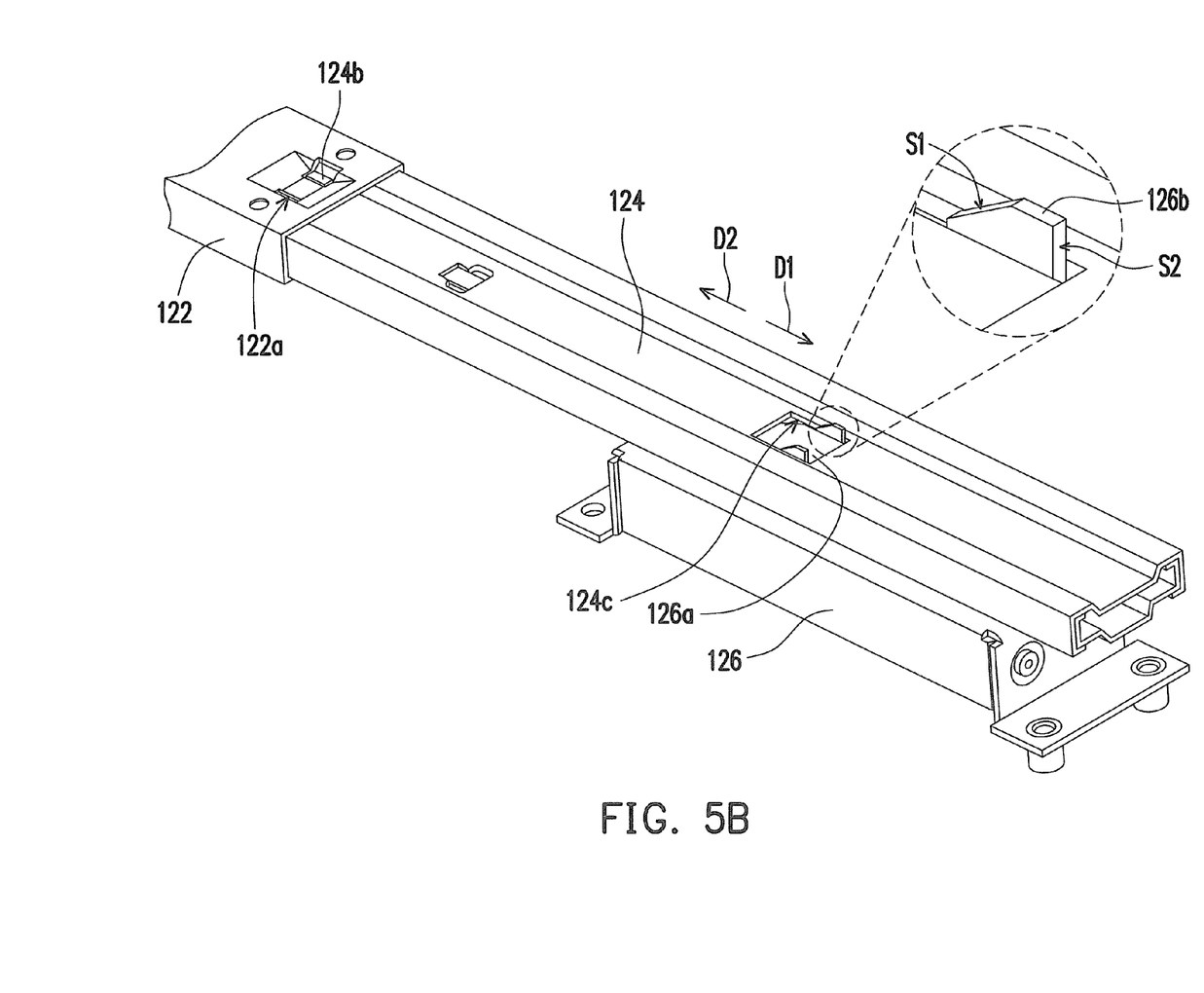
Figure 6:
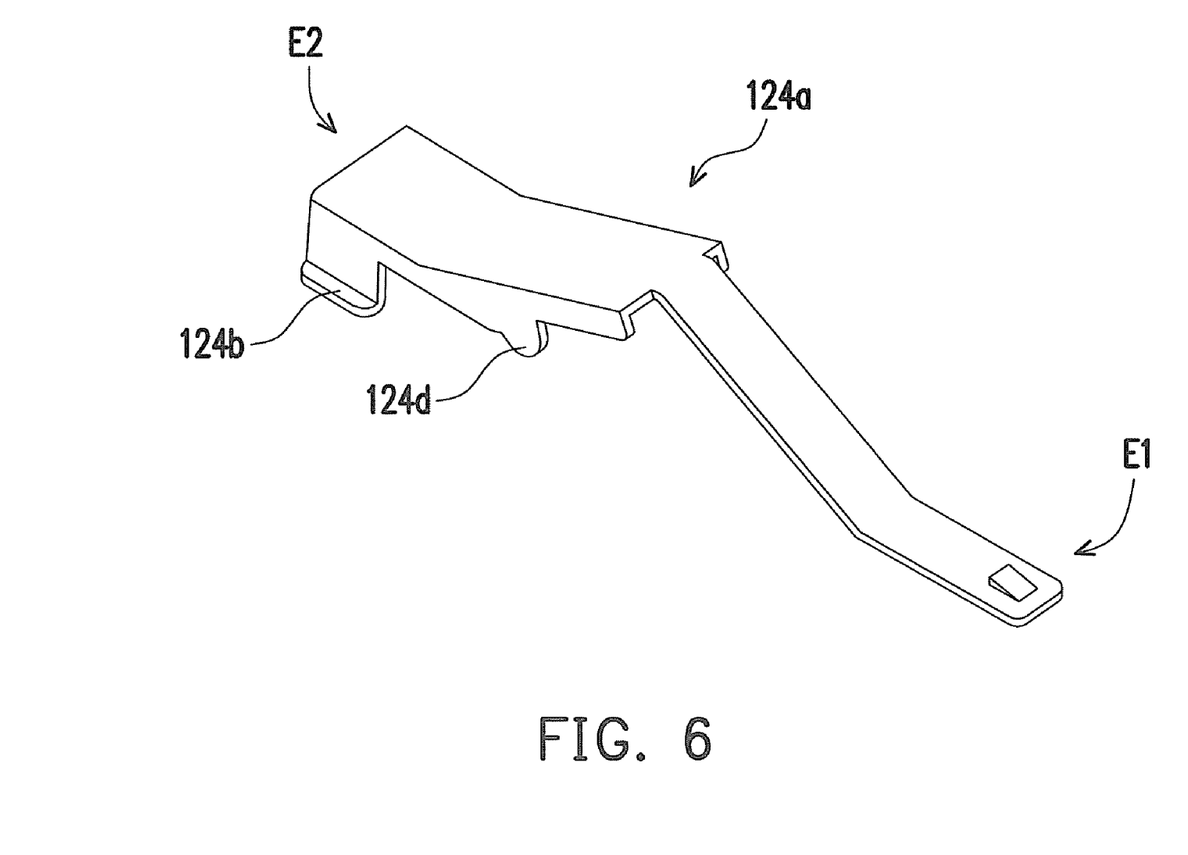
FIG. 6 is a three-dimensional view of a first elastic piece of FIG. 4.

Since now the second sliding element 126 cannot continually move along the first direction D1 relative to the first rail 122 due to the structural interference of the first locking hook 124b and the locking slot 122a, when the user continually pulls out the electronic module 130, the second sliding element 126 resists an elastic force of the first elastic piece 124a and crosses over the first elastic piece 124a to reach a position shown in FIG. 5B. Now, the electronic module 130 is entirely pulled out from the chassis 110 as that shown in FIG. 3, so that the user can repair or replace the electronic module 130.

In detail, when the first locking hook 124b is structurally interfered with the locking slot 122a of the first rail 122 as that shown in FIG. 5A, the first sliding element 124 is partially protruded out from the first rail 122. Therefore, when the second sliding element 126 is slid to the position shown in FIG. 5B, it is departed from the first rail 122, so that the electronic module 130 fixed to the second sliding element 126 is departed from the first rail 122 and is entirely pulled out from the chassis 110 as that shown in FIG. 3.

Figure 7:
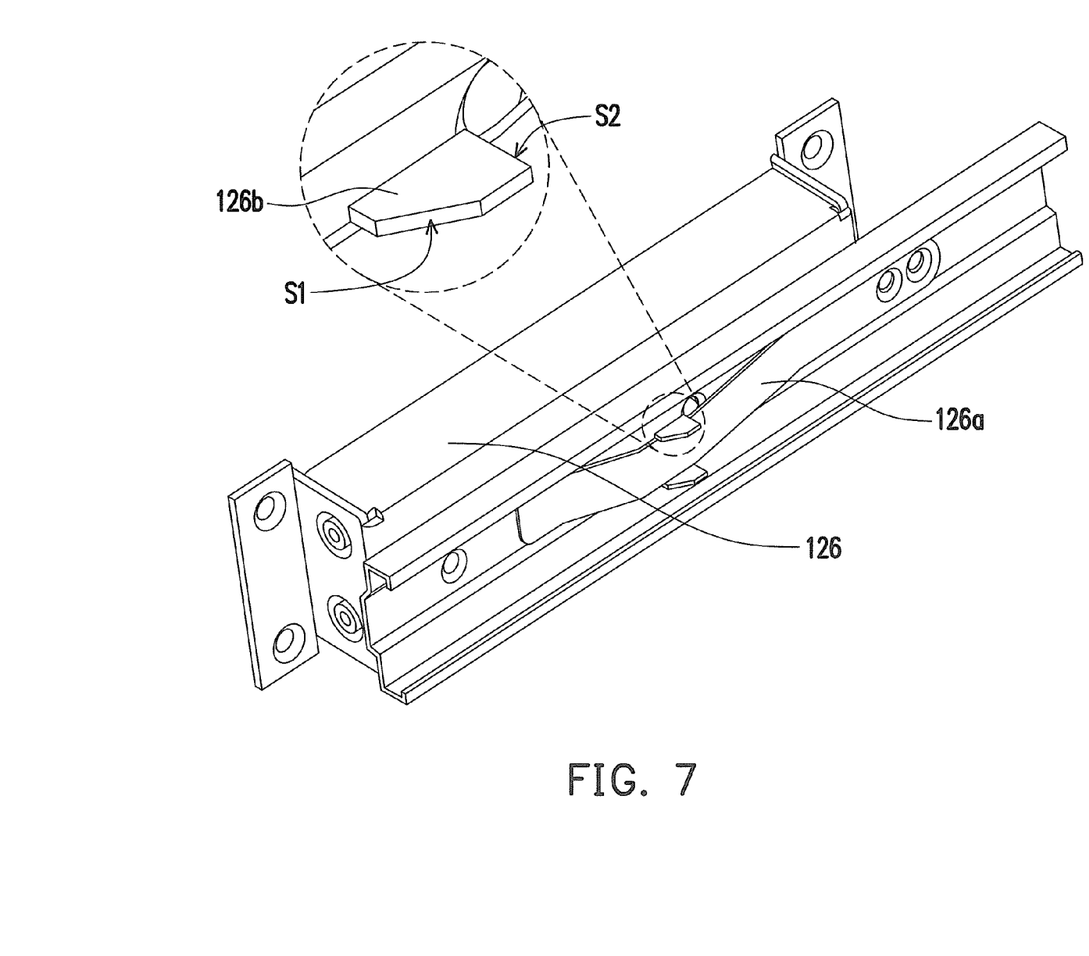
FIG. 7 is a three-dimensional view of a second sliding element of FIG. 5B.

FIG. 7 is a three-dimensional view of the second sliding element of FIG. 5B. Referring to FIG. 5B and FIG. 7, in the present embodiment, the first sliding element 124 has a locking slot 124c, and the second sliding element 126 has a second elastic piece 126a. When the second sliding element 126 reaches the position shown in FIG. 5B, one end of the second elastic piece 126a is buckled to the locking slot 124c to stop the second sliding element 126 from continually moving along the first direction D1, so as to prevent the electronic module 130 and the second sliding module 126 from falling off from the first sliding element 124.

In detail, referring to FIG. 5B and FIG. 7, the second elastic piece 126a has a second locking hook 126b, and the second locking hook 126b is adapted to be buckled to the locking slot 124c. The second locking hook 126b has a guiding slope S1 and a stop surface S2 opposite to the guiding slope. The second locking hook 126b is adapted to be guided by the guiding slope S1 to buckle to the locking slot 124c, and is positioned at the locking slot 124c due to interference of the stop surface S2.

Figure 5C:
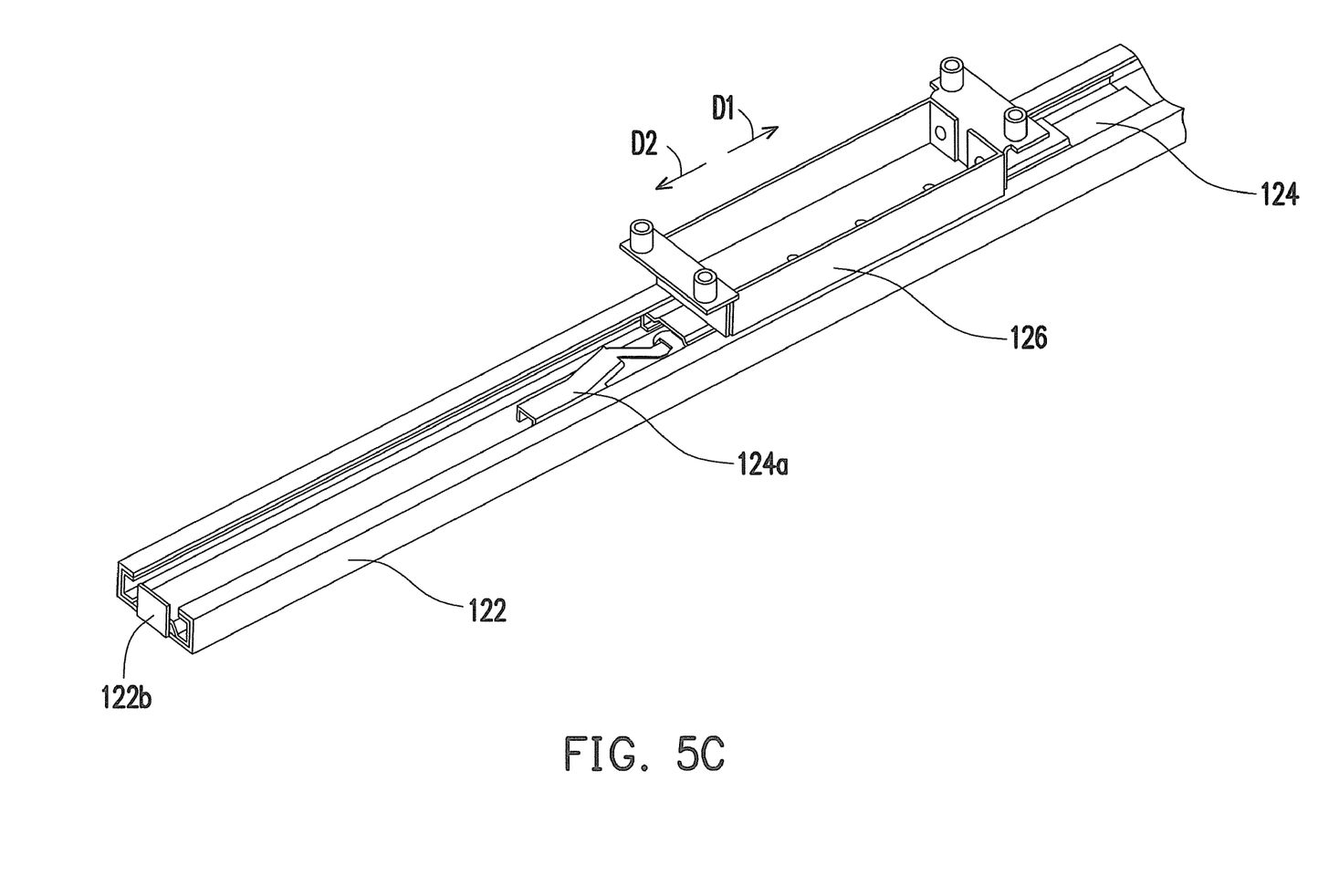
Figure 5D:
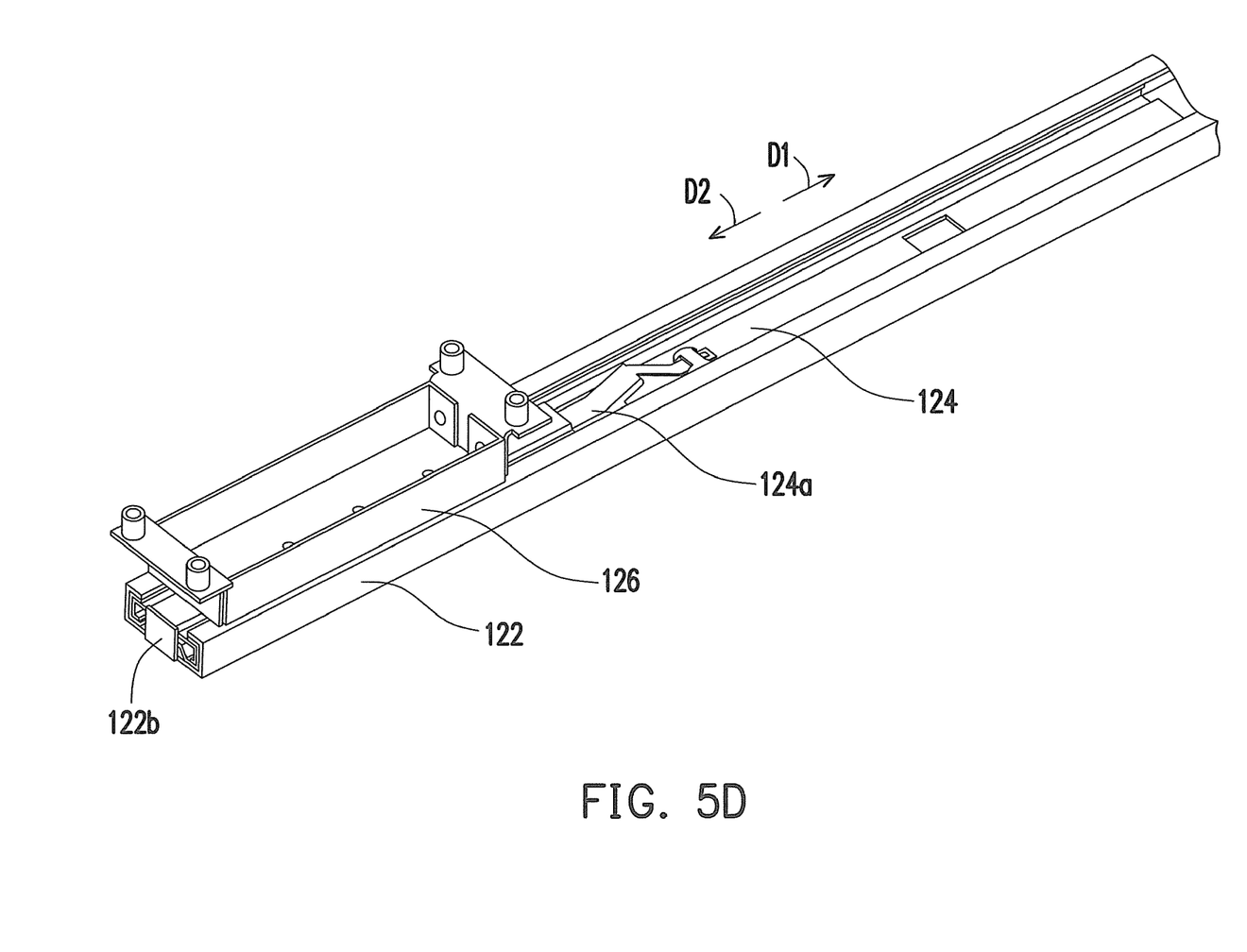

As shown in FIG. 5C and FIG. 5D, in the present embodiment, the first rail 122 has a blocking wall 122b. When the user wants to push the electronic module 130 into the chassis 110, the user pushes the electronic module 130 of FIG. 3 to drive the second sliding element 126 to move from the position shown in FIG. 3 to move along a second direction D2 opposite to the first direction D1, so that the second sliding element 126 pushes the first elastic piece 124a to drive the first sliding element 124 to move from the position shown in FIG. 5B to the position shown in FIG. 5C along the second direction D2, so that the first sliding element 124 leans against the blocking wall 122b.

Since now the first sliding element 124 is blocked by the blocking wall 122b and cannot continually slide along the second direction D2 relative to the first rail 122, when the user continually pushes the electronic module 130, the second siding element 126 resists the elastic force of the first elastic piece 124a and crosses over the first elastic piece 124 to reach the position shown in FIG. 5D. Now, the second sliding element 126 also leans against the blocking wall 122b and cannot continually slide along the second direction D2, so as to limit a sliding range of the electronic module 130 in the chassis 110.

Referring to FIG. 3, in the present embodiment, the rail module 120 further includes a second rail 128 and a third sliding element 129. The second rail 128 is disposed in the chassis 110 and parallel to the first rail 122, and the third sliding element 129 is slidably disposed on the second rail 128. The electronic module 130 is fixed to the third sliding element 129 and located between the first rail 122 and the second rail 128. By configuring the second rail 128 and the third sliding element 129, the electronic module 130 can be slidably disposed in the chassis 110, stably.

Moreover, referring to FIG. 4 and FIG. 6, in the present embodiment, the first elastic piece 124a has a supporting portion 124d. The supporting portion 124d faces to the first rail 122 and props up the first locking hook 124b from the first rail 122, so as to facilitate the second sliding element 126 to contact the first locking hook 124b. In detail, a first end E1 of the first elastic piece 124a is fixed to a surface of the first sliding element 124, and the first locking hook 124b and the supporting portion 124d are formed on a second end E2 of the first elastic piece 124a. When the second sliding element 126 is located at the position shown in FIG. 4, the second end E2 is located between the first end E1 and the second sliding element 126

Figure 8:
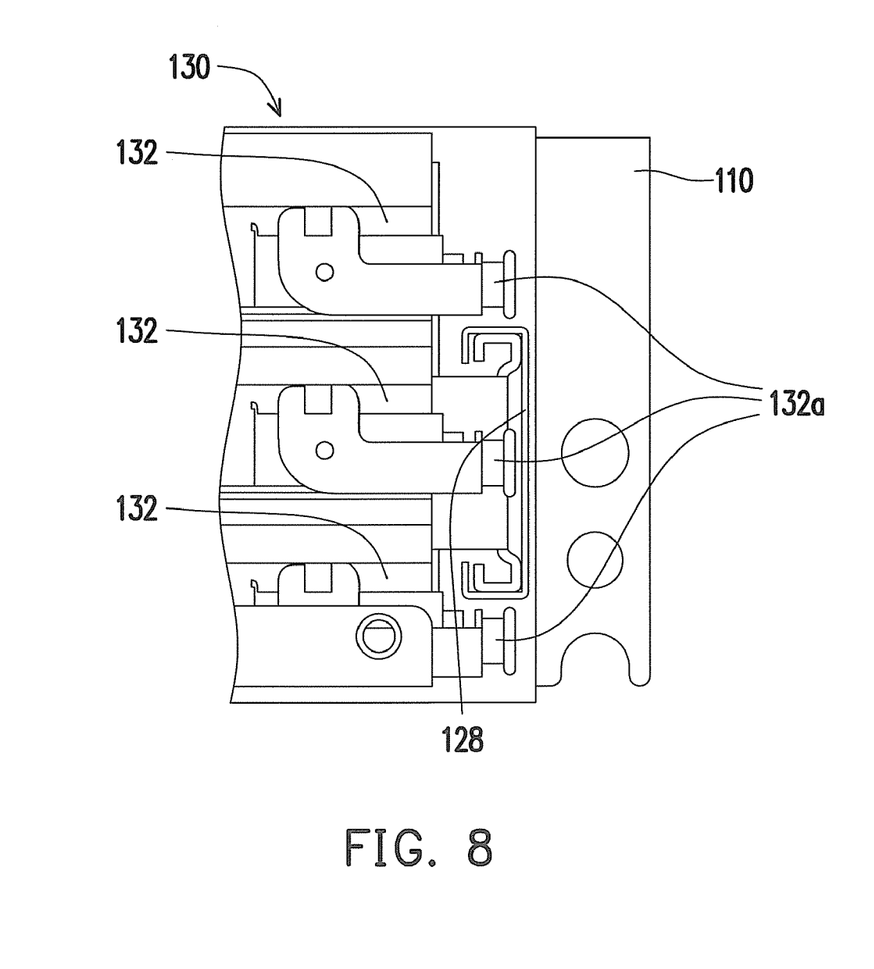
FIG. 8 is a partial cross-sectional view of the electronic device of FIG. 1.

FIG. 8 is a partial cross-sectional view of the electronic device of FIG. 1. Referring to FIG. 8, in the present embodiment, the electronic module 130 includes a plurality of had discs 132, and each of the hard discs 132 has a handle 132a. When the electronic module 130 is located in the chassis 110, at least a part of the handles 132a is located in the second slide rail 128, so as to save a configuration space.

In summary, in the invention, the first sliding element is slidably disposed on the first rail, and the second sliding element fixed to the electronic module is slidably disposed on the first sliding element, and the first sliding element has the first elastic piece adapted to be pushed by the second sliding element. Based on interactions of the first sliding element, the second sliding element and the first elastic piece, the rail module may achieve a multi-stage sliding effect. The electronic module can be entirely pulled out from the chassis along with sliding of the first sliding element and the second sliding element, so that the user can easily repair or replace the electronic module.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic device, comprising:
   a chassis; a rail module, comprising: a first rail, disposed in the chassis, and having a first locking slot;
   a first sliding element, slidably disposed on the first rail and having a first elastic piece, wherein the first elastic piece has a first locking hook facing to the first rail; and
   a second sliding element, slidably disposed on the first sliding element and suitable for sliding along a path relatively to the first sliding element, wherein the first locking hook leans against the first rail and is slided on the path, when the second sliding element is driven to move from a first position along a first direction, the second sliding element pushes the first locking hook to drive the first sliding element to move to the first locking slot along the first direction, so that the first locking hook is buckled to the first locking slot and moves away from the path along the first direction, and
   when the second sliding element is continually driven to move along the first direction, the second sliding element resists an elastic force of the first elastic piece and crosses over the first elastic piece to stay in a second position; and
an electronic module, fixed to the second sliding element, wherein when the second sliding element is located at the first position, the electronic module is located in the chassis, and when the second sliding element is located at the second position, the electronic module is entirely pulled out from the chassis.

2. The electronic device as claimed in claim 1, wherein the electronic device is a server, and the electronic module is a hard disc module.

3. The electronic device as claimed in claim 1, wherein the first sliding element has a second locking slot, and the second sliding element has a second elastic piece, when the second sliding element reaches the second position, one end of the second elastic piece is buckled to the second locking slot to stop the second sliding element from continually moving along the first direction.

4. The electronic device as claimed in claim 3, wherein the second elastic piece has a second locking hook, and the second locking hook is adapted to be buckled to the second locking slot, the second locking hook has a guiding slope and a stop surface opposite to the guiding slope, the second locking hook is adapted to be guided by the guiding slope to buckle to the second locking slot, and is adapted to be positioned at the second locking slot due to interference of the stop surface.

5. The electronic device as claimed in claim 1, wherein the first rail has a blocking wall, when the second sliding element is driven to move from the second position along a second direction opposite to the first direction to push the first elastic piece, the first sliding element is driven to move towards the blocking wall and leans against the blocking wall, so that the first sliding element is blocked from moving along the second direction, when the second sliding element is continually driven to move along the second direction, the second siding element resists the elastic force of the first elastic piece and crosses over the first elastic piece to reach the first position, and when the second sliding element is located at the first position, the second sliding element leans against the blocking wall, so that the second sliding element is blocked from moving along the second direction.

6. The electronic device as claimed in claim 1, wherein the rail module further comprises:
a second rail, disposed in the chassis and parallel to the first rail; and
a third sliding element, slidably disposed on the second rail and fixed to the electronic module, wherein the electronic module is located between the first rail and the second rail.

7. The electronic device as claimed in claim 6, wherein the electronic module comprises a plurality of hard discs, and each of the hard discs has a handle, and when the electronic module is located in the chassis, at least a part of the handles is located in the second slide rail.

8. The electronic device as claimed in claim 1, wherein when the first locking hook of the first sliding element is buckled to the first locking slot, the first sliding element is partially protruded out from the first rail, and the second position is located at the part of the first sliding element protruded out from the first rail.

9. The electronic device as claimed in claim 1, wherein the first elastic piece has a supporting portion, and the supporting portion faces to the first rail and props up the first locking hook from the first rail so as to facilitate the second sliding element to contact the first locking hook.

10. The electronic device as claimed in claim 9, wherein a first end of the first elastic piece is fixed to a surface of the first sliding element, and the first locking hook and the supporting portion are formed on a second end of the first elastic piece, and when the second sliding element is located at the first position, the second end is located between the first end and the second sliding element.

11. A rail module, adapted to an electronic device comprising a chassis and an electronic module, the rail module comprising:
a first rail, disposed in the chassis and having a first locking slot;
a first sliding element, slidably disposed on the first rail and having a first elastic piece, wherein the first elastic piece has a first locking hook facing to the first rail; and
a second sliding element, slidably disposed on the first sliding element and fixed to the electronic module, and suitable of sliding along a path relatively to the first sliding element, wherein the first locking hook leans against the first rail and is slided on the path, when the second sliding element is driven to move from a first position along a first direction, the second sliding element pushes the first locking hook to drive the first sliding element to move to the first locking slot along the first direction, so that the first locking hook is buckled to the first locking slot and moves away from the path along the first direction,
when the second sliding element is continually driven to move along the first direction, the second sliding element resists an elastic force of the first elastic piece and crosses over the first elastic piece to stay in a second position, when the second sliding element is located at the first position, the electronic module is located in the chassis, and when the second sliding element is located at the second position, the electronic module is entirely pulled out from the chassis.

12. The rail module as claimed in claim 11, the first sliding element has a second locking slot, and the second sliding element has a second elastic piece, when the second sliding element reaches the second position, one end of the second elastic piece is buckled to the second locking slot to stop the second sliding element from continually moving along the first direction.

13. The rail module as claimed in claim 12, wherein the second elastic piece has a second locking hook, and the second locking hook is adapted to be buckled to the second locking slot, the second locking hook has a guiding slope and a stop surface opposite to the guiding slope, the second locking hook is adapted to be guided by the guiding slope to buckle to the second locking slot, and is adapted to be positioned at the second locking slot due to interference of the stop surface.

14. The rail module as claimed in claim 11, wherein the first rail has a blocking wall, when the second sliding element is driven to move from the second position along a second direction opposite to the first direction to push the first elastic piece, the first sliding element is driven to move towards the blocking wall and leans against the blocking wall, so that the first sliding element is blocked from moving along the second direction, when the second sliding element is continually driven to move along the second direction, the second siding element resists the elastic force of the first elastic piece and crosses over the first elastic piece to reach the first position, and when the second sliding element is located at the first position, the second sliding element leans against the blocking wall, so that the second sliding element is blocked from moving along the second direction.

15. The rail module as claimed in claim 11, further comprising:
a second rail, disposed in the chassis and parallel to the first rail; and
a third sliding element, slidably disposed on the second rail and fixed to the electronic module, wherein the electronic module is located between the first rail and the second rail.

16. The rail module as claimed in claim 15, wherein the electronic module comprises a plurality of hard discs, and each of the hard discs has a handle, and when the electronic module is located in the chassis, at least a part of the handles is located in the second slide rail.

17. The rail module as claimed in claim 11, wherein when the first locking hook of the first sliding element is buckled to the first locking slot, the first sliding element is partially protruded out from the first rail, and the second position is located at the part of the first sliding element protruded out from the first rail.

18. The rail module as claimed in claim 11, wherein the first elastic piece has a supporting portion, and the supporting portion faces to the first rail and props up the first locking hook from the first rail so as to facilitate the second sliding element to contact the first locking hook.

19. The rail module as claimed in claim 18, wherein a first end of the first elastic piece is fixed to a surface of the first sliding element, and the first locking hook and the supporting portion are formed on a second end of the first elastic piece, and when the second sliding element is located at the first position, the second end is located between the first end and the second sliding element.

* * * * *